US012647072B2

(12) United States Patent
Jha et al.

(10) Patent No.: US 12,647,072 B2
(45) Date of Patent: Jun. 2, 2026

(54) VOLTAGE-CONTROLLED OSCILLATOR (VCO) HAVING CASCODE TRANSISTORS WITH IMPROVED SIGNAL QUALITY AND GAIN

(71) Applicant: QUALCOMM Incorporated, San Diego, CA (US)

(72) Inventors: Amit Jha, Cupertino, CA (US); Ngar Loong Alan Chan, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 60 days.

(21) Appl. No.: 18/390,825

(22) Filed: Dec. 20, 2023

(65) Prior Publication Data

US 2025/0211169 A1 Jun. 26, 2025

(51) Int. Cl.
H03B 5/12 (2006.01)
H03F 3/24 (2006.01)

(52) U.S. Cl.
CPC ......... H03B 5/1253 (2013.01); H03B 5/1212 (2013.01); H03F 3/245 (2013.01); *H03F 2200/294* (2013.01); *H03F 2200/451* (2013.01)

(58) Field of Classification Search
CPC ....... H03B 5/125; H03B 5/1212; H03F 3/245; H03F 2200/294; H03F 2200/451
USPC ...................................... 331/177 V
See application file for complete search history.

(56) References Cited

U.S. PATENT DOCUMENTS

| | | | |
|---|---|---|---|
| 9,344,036 B1 | 5/2016 | Chang | |
| 11,228,280 B1 * | 1/2022 | Bahr | H03B 5/04 |

| | | | |
|---|---|---|---|
| 2009/0102571 A1 | 4/2009 | Park et al. | |
| 2018/0316310 A1 | 11/2018 | Pentakota et al. | |
| 2024/0162864 A1 * | 5/2024 | Ishihara | H03F 3/195 |

FOREIGN PATENT DOCUMENTS

CN          115276603 A          11/2022

OTHER PUBLICATIONS

Bonfanti A., et al., "Flicker Noise Up-Conversion due to Harmonic Distortion in Van der Pol CMOS Oscillators," IEEE Transactions on Circuits and Systems I: Regular Papers, Jul. 2012, vol. 59, No. 7, pp. 1418-1430, DOI: 10.1109/TCSI.2011.2177132.
Hajimiri A., et al., "A General Theory of Phase Noise in Electrical Oscillators," IEEE Journal of Solid-State Circuits, Feb. 1998, vol. 33, No. 2, pp. 179-194, DOI: 10.1109/4.658619.

(Continued)

*Primary Examiner* — Richard Tan

(74) *Attorney, Agent, or Firm* — Patterson + Sheridan LLP

(57) ABSTRACT

Certain aspects of the present disclosure are directed towards a voltage-controlled oscillator (VCO). The VCO may include: a first n-type metal-oxide-semiconductor (NMOS) transistor having a gate coupled to a first output of the VCO; a second NMOS transistor having a gate coupled to a second output of the VCO; a first NMOS cascode transistor coupled in cascode between the first NMOS transistor and the second output; and a second NMOS cascode transistor coupled in cascode between the second NMOS transistor and the first output, wherein gates of the first NMOS cascode transistor and the second NMOS cascode transistor are coupled to a common-mode voltage (Vcm) node of the VCO.

23 Claims, 12 Drawing Sheets

(56)          References Cited

OTHER PUBLICATIONS

Jerng A., et al., "The Impact of Device Type and Sizing on Phase Noise Mechanisms," IEEE Journal of Solid-State Circuits, Feb. 2005, vol. 40, No. 2, pp. 360-369, DOI: 10.1109/JSSC.2004. 841035.

Karthigeyan A., et al., "Single Event Transient Mitigation Techniques for a Cross-coupled LC Oscillator, Including a Single-event Transient Hardened CMOS LC-VCO Circuit", The Institution of Engineering and Technology (IET), vol. 16, Issue. 2, Aug. 2021, pp. 178-188.

Meng F., et al., "Ultra Wide-Band Inductive Peaking VCO with Cascode Noise Reduction", IEEE International Symposium on Circuits and Systems (ISCAS), 2018, 5 Pages, DOI: 10.1109/ISCAS. 2018.8350973.

Park B., et al., "A 12-GHz Fully Integrated Cascode CMOS LC VCO With Q-Enhancement Circuit", IEEE Microwave and Wireless Components Letters, vol. 18, No. 2, Feb. 2008, pp. 133-135.

Pepe F., et al., "Suppression of Flicker Noise Up-Conversion in a 65-nm CMOS VCO in the 3.0-to-3.6 GHz Band," IEEE Journal of Solid-State Circuits, Oct. 2013, vol. 48, No. 10, pp. 2375-2389, DOI: 10.1109/JSSC.2013.2273181.

Shin H., et al., "A CMOS Voltage-controlled Oscillator Using a Cascode Structure", Microwave and Optical Technology Letters, Jul. 2016, vol. 58, No. 7, pp. 1560-1563, DOI: 10.1002/mop.29860.

* cited by examiner

500

| Gm Size | Cascode Size Range |
|---------|-------------------|
| 15u/30n | 50u/30n -- 60u/30n |
| 20u/30n | 32.5u/30n -- 45u/30n |
| 25u/30n | 17.5u/30n -- 27.5u/30n |
| 30u/30n | 7.5u/30n -- 15u/30n |

1200

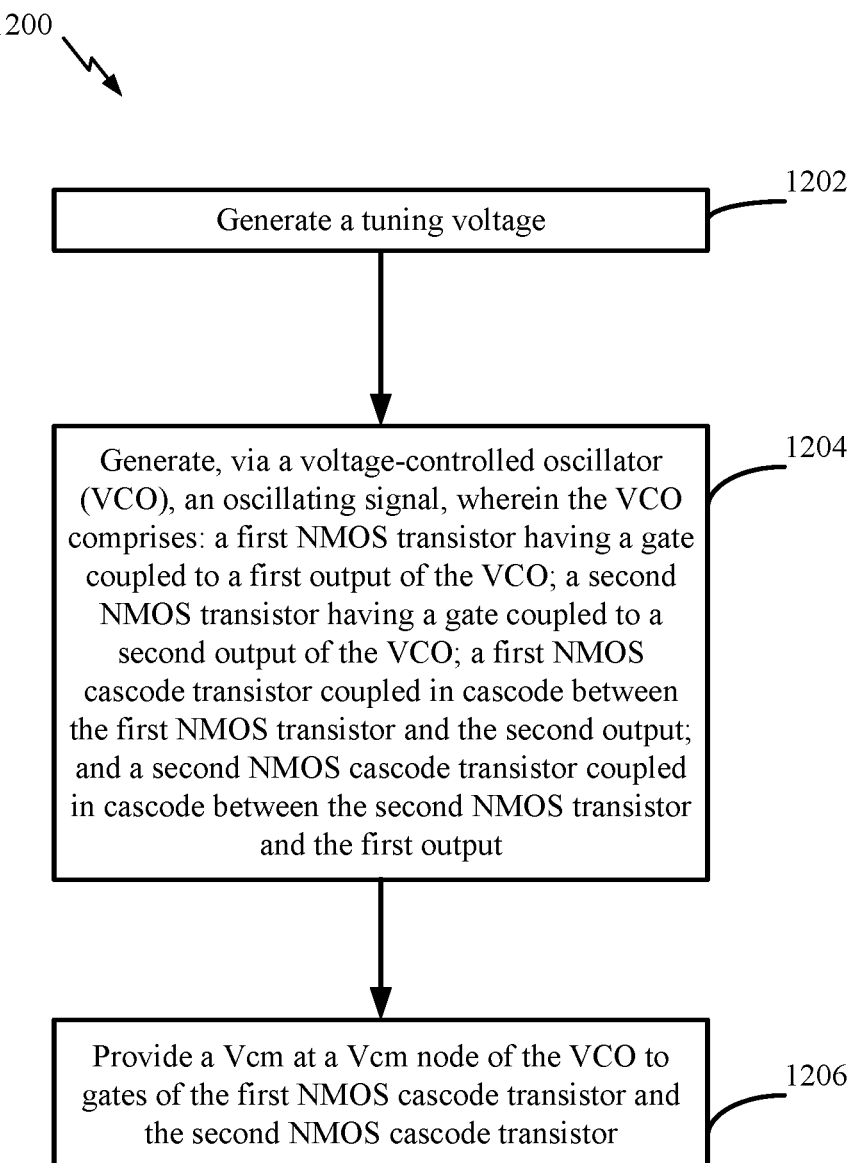

1202
Generate a tuning voltage

1204
Generate, via a voltage-controlled oscillator
(VCO), an oscillating signal, wherein the VCO
comprises: a first NMOS transistor having a gate
coupled to a first output of the VCO; a second
NMOS transistor having a gate coupled to a
second output of the VCO; a first NMOS
cascode transistor coupled in cascode between
the first NMOS transistor and the second output;
and a second NMOS cascode transistor coupled
in cascode between the second NMOS transistor
and the first output 1206
Provide a Vcm at a Vcm node of the VCO to
gates of the first NMOS cascode transistor and
the second NMOS cascode transistor

FIG. 12

VOLTAGE-CONTROLLED OSCILLATOR (VCO) HAVING CASCODE TRANSISTORS WITH IMPROVED SIGNAL QUALITY AND GAIN

TECHNICAL FIELD

Certain aspects of the present disclosure generally relate to electronic circuits and, more particularly, to a voltage-controlled oscillator (VCO).

BACKGROUND

Wireless communication devices are widely deployed to provide various communication services such as telephony, video, data, messaging, broadcasts, and so on. Such wireless communication devices may transmit and/or receive radio frequency (RF) signals via any of various suitable radio access technologies (RATs) including, but not limited to, Fifth Generation (5G) New Radio (NR), Long Term Evolution (LTE), Code Division Multiple Access (CDMA), Time Division Multiple Access (TDMA), Wideband CDMA (WCDMA), Global System for Mobility (GSM), Bluetooth, Bluetooth Low Energy (BLE), ZigBee, wireless local area network (WLAN) RATs (e.g., WiFi), and the like.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include one or more frequency synthesizers.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include increased quality factor for a voltage-controlled oscillator (VCO).

Certain aspects of the present disclosure are directed towards a VCO. The VCO generally includes: a first n-type metal-oxide-semiconductor (NMOS) transistor having a gate coupled to a first output of the VCO; a second NMOS transistor having a gate coupled to a second output of the VCO; a first NMOS cascode transistor coupled in cascode between the first NMOS transistor and the second output; and a second NMOS cascode transistor coupled in cascode between the second NMOS transistor and the first output, wherein gates of the first NMOS cascode transistor and the second NMOS cascode transistor are coupled to a common-mode voltage (Vcm) node of the VCO.

Certain aspects of the present disclosure are directed towards a method for generating an oscillating signal. The method generally includes: generating, via a VCO, an oscillating signal, wherein the VCO comprises a first NMOS transistor having a gate coupled to a first output of the VCO, a second NMOS transistor having a gate coupled to a second output of the VCO, a first NMOS cascode transistor coupled in cascode between the first NMOS transistor and the second output, and a second NMOS cascode transistor coupled in cascode between the second NMOS transistor and the first output; and providing a Vcm at a Vcm node of the VCO to gates of the first NMOS cascode transistor and the second NMOS cascode transistor.

Certain aspects of the present disclosure are directed towards a VCO. The VCO generally includes: a first p-type metal-oxide-semiconductor (PMOS) transistor having a gate coupled to a first output of the VCO; a second PMOS transistor having a gate coupled to a second output of the VCO; a first PMOS cascode transistor coupled in cascode between the first PMOS transistor and the second output; and a second PMOS cascode transistor coupled in cascode between the second PMOS transistor and the first output, wherein gates of the first PMOS cascode transistor and the second PMOS cascode transistor are coupled to a reference potential node.

Certain aspects of the present disclosure are directed towards a transceiver. The transceiver generally includes: a mixer; and a synthesizer having an output coupled to an input of the mixer, wherein the synthesizer comprises a VCO including: a first NMOS transistor having a gate coupled to a first output of the VCO; a second NMOS transistor having a gate coupled to a second output of the VCO; a first NMOS cascode transistor coupled in cascode between the first NMOS transistor and the second output; and a second NMOS cascode transistor coupled in cascode between the second NMOS transistor and the first output, wherein gates of the first NMOS cascode transistor and the second NMOS cascode transistor are coupled to a Vcm node of the VCO.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 12 is a flow diagram illustrating example operations for signal processing, in accordance with certain aspects of the present disclosure.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure are directed towards a voltage-controlled oscillator (VCO). The VCO may be implemented using cascode transistors coupled to cross-coupled transistors. In some aspects, to reduce device size, gates of the cascode transistors may be coupled to a common-mode voltage (Vcm) node of the VCO or to a reference potential node, as described in more detail herein. In some aspects, the size of the cascode transistors may be selected to reduce one or more harmonics of the oscillating signal generated by the VCO. For example, the size of the cascode transistors may be selected such that a third harmonic current of the VCO is reduced, which might otherwise cause the cross-coupled transistors of the VCO to enter a cut-off region of operation, thereby degrading VCO performance. In some cases, the VCO may be implemented with one or more filters used to filter noise of the VCO, decreasing VCO phase noise.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
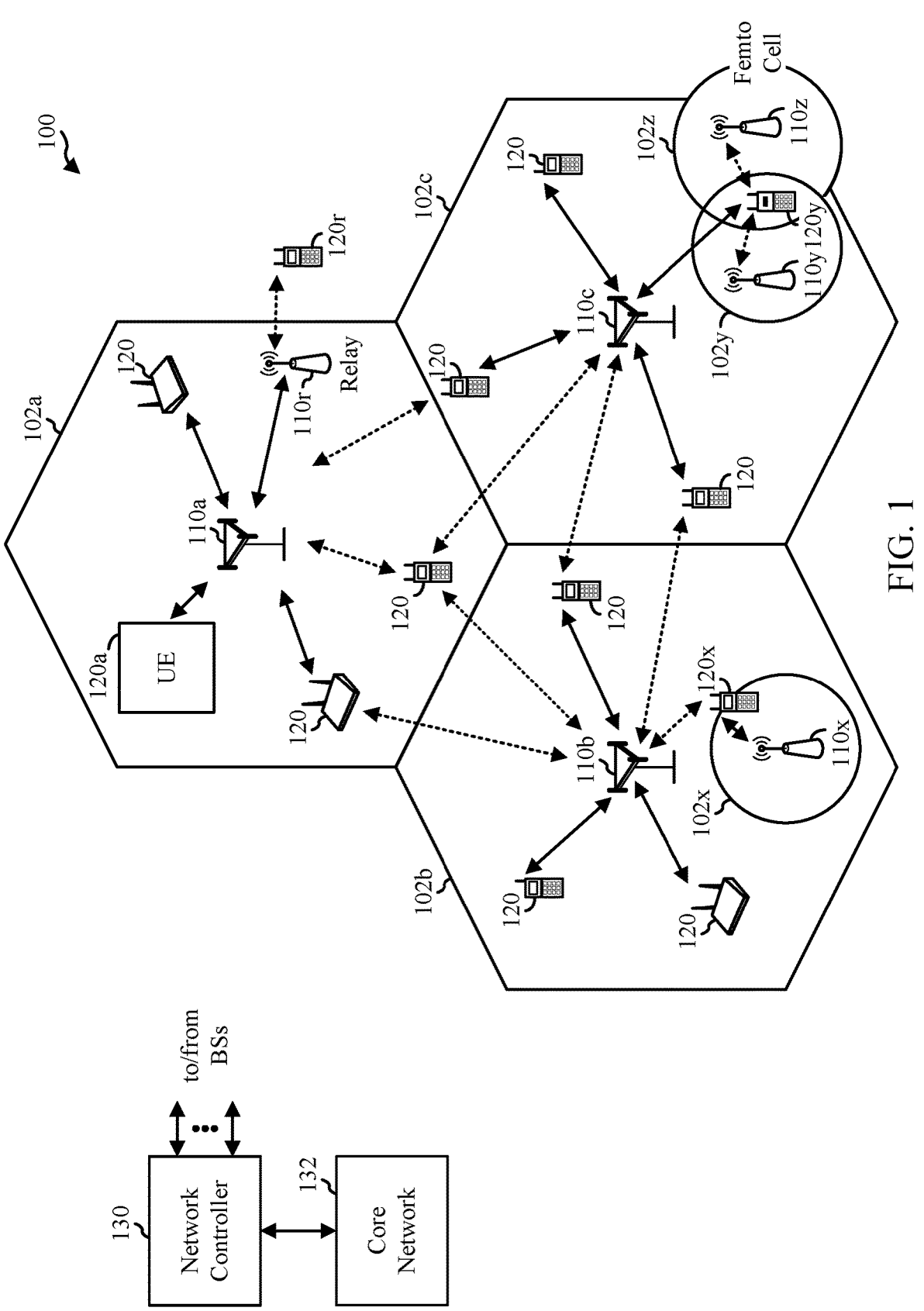
FIG. 1 is a diagram of an example wireless communications network, in which aspects of the present disclosure may be practiced.

FIG. 1 illustrates an example wireless communications network 100, in which aspects of the present disclosure may be practiced. For example, the wireless communications network 100 may be a New Radio (NR) system (e.g., a Fifth Generation (5G) NR network), an Evolved Universal Terrestrial Radio Access (E-UTRA) system (e.g., a Fourth Generation (4G) network), a Universal Mobile Telecommunications System (UMTS) (e.g., a Second Generation/Third Generation (2G/3G) network), or a code division multiple access (CDMA) system (e.g., a 2G/3G network), or may be configured for communications according to an IEEE standard such as one or more of the 802.11 standards, etc.

As illustrated in FIG. 1, the wireless communications network 100 may include a number of base stations (BSs) 110*a-z* (each also individually referred to herein as "BS 110" or collectively as "BSs 110") and other network entities. A BS may also be referred to as an access point (AP), an evolved Node B (eNodeB or eNB), a next generation Node B (gNodeB or gNB), or some other terminology.

A BS 110 may provide communication coverage for a particular geographic area, sometimes referred to as a "cell," which may be stationary or may move according to the location of a mobile BS. In some examples, the BSs 110 may be interconnected to one another and/or to one or more other BSs or network nodes (not shown) in wireless communications network 100 through various types of backhaul interfaces (e.g., a direct physical connection, a wireless connection, a virtual network, or the like) using any suitable transport network. In the example shown in FIG. 1, the BSs 110*a*, 110*b*, and 110*c* may be macro BSs for the macro cells 102*a*, 102*b*, and 102*c*, respectively. The BS 110*x* may be a pico BS for a pico cell 102*x*. The BSs 110*y* and 110*z* may be femto BSs for the femto cells 102*y* and 102*z*, respectively. A BS may support one or multiple cells.

The BSs 110 communicate with one or more user equipments (UEs) 120*a-y* (each also individually referred to herein as "UE 120" or collectively as "UEs 120") in the wireless communications network 100. A UE may be fixed or mobile and may also be referred to as a user terminal (UT), a mobile station (MS), an access terminal, a station (STA), a client, a wireless device, a mobile device, or some other terminology. A user terminal may be a wireless device, such as a cellular phone, a smartphone, a personal digital assistant (PDA), a handheld device, a wearable device, a wireless modem, a laptop computer, a tablet, a personal computer, etc.

The BSs 110 are considered transmitting entities for the downlink and receiving entities for the uplink. The UEs 120 are considered transmitting entities for the uplink and receiving entities for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink. $N_{up}$ UEs may be selected for simultaneous transmission on the uplink, $N_{dn}$ UEs may be selected for simultaneous transmission on the downlink. $N_{up}$ may or may not be equal to $N_{dn}$, and $N_{up}$ and $N_{dn}$ may be static values or can change for each scheduling interval. Beam-steering or some other spatial processing technique may be used at the BSs 110 and/or UEs 120.

The UEs 120 (e.g., 120x, 120y, etc.) may be dispersed throughout the wireless communications network 100, and each UE 120 may be stationary or mobile. The wireless communications network 100 may also include relay stations (e.g., relay station 110r), also referred to as relays or the like, that receive a transmission of data and/or other information from an upstream station (e.g., a BS 110a or a UE 120r) and send a transmission of the data and/or other information to a downstream station (e.g., a UE 120 or a BS 110), or that relays transmissions between UEs 120, to facilitate communication between devices.

The BSs 110 may communicate with one or more UEs 120 at any given moment on the downlink and uplink. The downlink (i.e., forward link) is the communication link from the BSs 110 to the UEs 120, and the uplink (i.e., reverse link) is the communication link from the UEs 120 to the BSs 110. A UE 120 may also communicate peer-to-peer with another UE 120.

The wireless communications network 100 may use multiple transmit and multiple receive antennas for data transmission on the downlink and uplink. BSs 110 may be equipped with a number $N_{ap}$ of antennas to achieve transmit diversity for downlink transmissions and/or receive diversity for uplink transmissions. A set Nu of UEs 120 may receive downlink transmissions and transmit uplink transmissions. Each UE 120 may transmit user-specific data to and/or receive user-specific data from the BSs 110. In general, each UE 120 may be equipped with one or multiple antennas. The Nu UEs 120 can have the same or different numbers of antennas.

The wireless communications network 100 may be a time division duplex (TDD) system or a frequency division duplex (FDD) system. For a TDD system, the downlink and uplink share the same frequency band. For an FDD system, the downlink and uplink use different frequency bands. The wireless communications network 100 may also utilize a single carrier or multiple carriers for transmission. Each UE 120 may be equipped with a single antenna (e.g., to keep costs down) or multiple antennas (e.g., where the additional cost can be supported).

A network controller 130 (also sometimes referred to as a "system controller") may be in communication with a set of BSs 110 and provide coordination and control for these BSs 110 (e.g., via a backhaul). In certain cases (e.g., in a 5G NR system), the network controller 130 may include a centralized unit (CU) and/or a distributed unit (DU). In certain aspects, the network controller 130 may be in communication with a core network 132 (e.g., a 5G Core Network (5GC)), which provides various network functions such as Access and Mobility Management, Session Management, User Plane Function, Policy Control Function, Authentication Server Function, Unified Data Management, Application Function, Network Exposure Function, Network Repository Function, Network Slice Selection Function, etc.

In certain aspects of the present disclosure, the BSs 110 and/or the UEs 120 may include a voltage-controlled oscillator (VCO) implemented with cascode transistors, as described in more detail herein.

Figure 2:
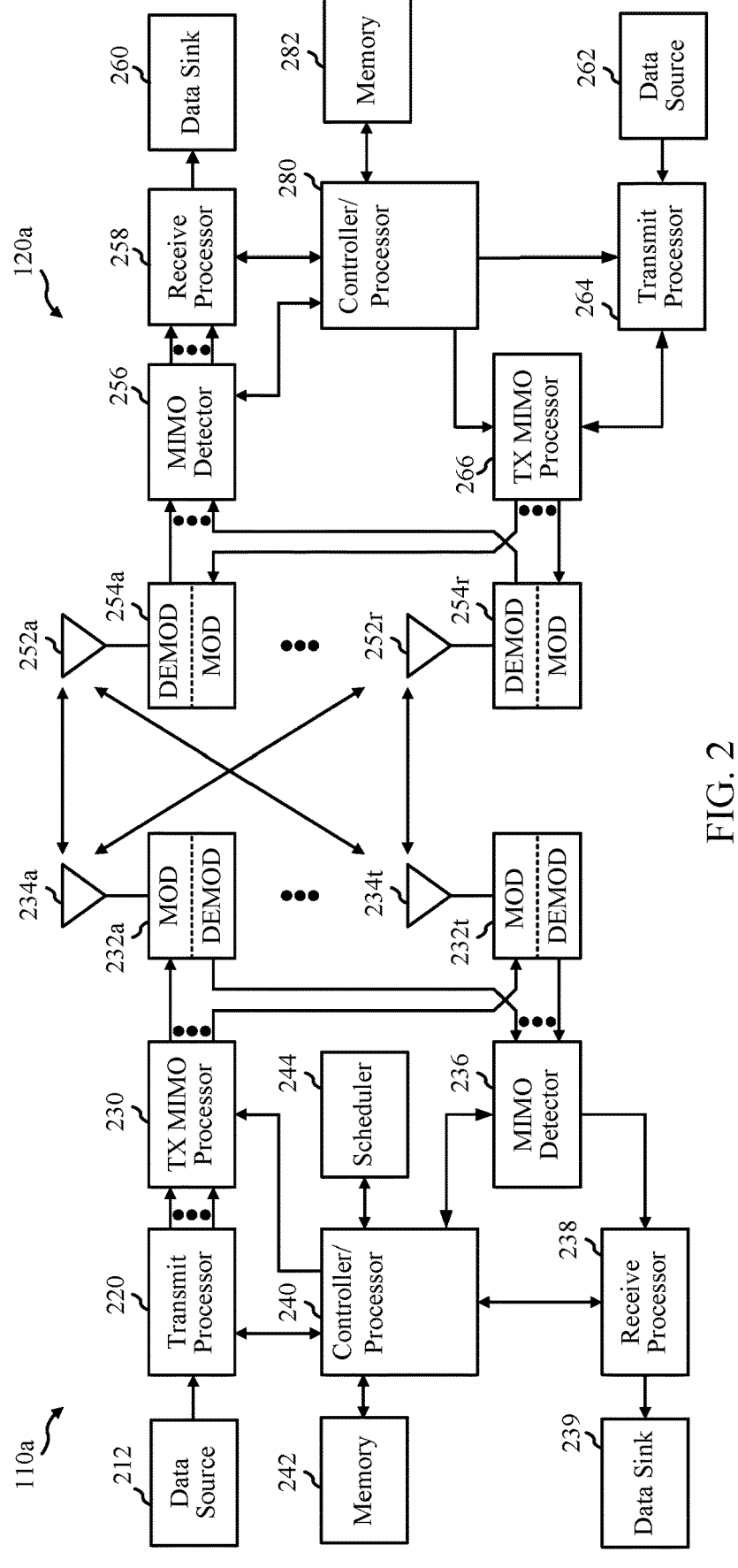
FIG. 2 is a block diagram conceptually illustrating a design of an example base station (BS) and user equipment (UE), in which aspects of the present disclosure may be practiced.

FIG. 2 illustrates example components of BS 110a and UE 120a (e.g., from the wireless communications network 100 of FIG. 1), in which aspects of the present disclosure may be implemented.

On the downlink, at the BS 110a, a transmit processor 220 may receive data from a data source 212, control information from a controller/processor 240, and/or possibly other data (e.g., from a scheduler 244). The various types of data may be sent on different transport channels. For example, the control information may be designated for the physical broadcast channel (PBCH), physical control format indicator channel (PCFICH), physical hybrid automatic repeat request (HARQ) indicator channel (PHICH), physical downlink control channel (PDCCH), group common PDCCH (GC PDCCH), etc. The data may be designated for the physical downlink shared channel (PDSCH), etc. A medium access control (MAC)-control element (MAC-CE) is a MAC layer communication structure that may be used for control command exchange between wireless nodes. The MAC-CE may be carried in a shared channel such as a PDSCH, a physical uplink shared channel (PUSCH), or a physical sidelink shared channel (PSSCH).

The processor 220 may process (e.g., encode and symbol map) the data and control information to obtain data symbols and control symbols, respectively. The transmit processor 220 may also generate reference symbols, such as for the primary synchronization signal (PSS), secondary synchronization signal (SSS), PBCH demodulation reference signal (DMRS), and channel state information reference signal (CSI-RS).

A transmit (TX) multiple-input, multiple-output (MIMO) processor 230 may perform spatial processing (e.g., precoding) on the data symbols, the control symbols, and/or the reference symbols, if applicable, and may provide output symbol streams to the modulators (MODs) in transceivers 232a-232t. Each modulator in transceivers 232a-232t may process a respective output symbol stream (e.g., for orthogonal frequency division multiplexing (OFDM), etc.) to obtain an output sample stream. Each of the transceivers 232a-232t may further process (e.g., convert to analog, amplify, filter, and upconvert) the output sample stream to obtain a downlink signal. Downlink signals from the transceivers 232a-232t may be transmitted via the antennas 234a-234t, respectively.

At the UE 120a, the antennas 252a-252r may receive the downlink signals from the BS 110a and may provide received signals to the transceivers 254a-254r, respectively. The transceivers 254a-254r may condition (e.g., filter, amplify, downconvert, and digitize) a respective received signal to obtain input samples. Each demodulator (DEMOD) in the transceivers 232a-232t may further process the input samples (e.g., for OFDM, etc.) to obtain received symbols. A MIMO detector 256 may obtain received symbols from all the demodulators in transceivers 254a-254r, perform MIMO detection on the received symbols if applicable, and provide detected symbols. A receive processor 258 may process (e.g., demodulate, deinterleave, and decode) the detected symbols, provide decoded data for the UE 120a to a data sink 260, and provide decoded control information to a controller/processor 280.

On the uplink, at UE 120*a*, a transmit processor 264 may receive and process data (e.g., for the physical uplink shared channel (PUSCH)) from a data source 262 and control information (e.g., for the physical uplink control channel (PUCCH)) from the controller/processor 280. The transmit processor 264 may also generate reference symbols for a reference signal (e.g., the sounding reference signal (SRS)). The symbols from the transmit processor 264 may be precoded by a TX MIMO processor 266 if applicable, further processed by the modulators (MODs) in transceivers 254*a*-254*r* (e.g., for single-carrier frequency division multiplexing (SC-FDM), etc.), and transmitted to the BS 110*a*. At the BS 110*a*, the uplink signals from the UE 120*a* may be received by the antennas 234, processed by the demodulators in transceivers 232*a*-232*t*, detected by a MIMO detector 236 if applicable, and further processed by a receive processor 238 to obtain decoded data and control information sent by the UE 120*a*. The receive processor 238 may provide the decoded data to a data sink 239 and the decoded control information to the controller/processor 240.

The memories 242 and 282 may store data and program codes for BS 110*a* and UE 120*a*, respectively. The memories 242 and 282 may also interface with the controllers/processors 240 and 280, respectively. A scheduler 244 may schedule UEs for data transmission on the downlink and/or uplink.

In certain aspects of the present disclosure, the transceivers 232 and/or the transceivers 254 may include a VCO implemented with cascode transistors, as described in more detail herein.

NR may utilize orthogonal frequency division multiplexing (OFDM) with a cyclic prefix (CP) on the uplink and downlink. NR may support half-duplex operation using time division duplexing (TDD). OFDM and single-carrier frequency division multiplexing (SC-FDM) partition the system bandwidth into multiple orthogonal subcarriers, which are also commonly referred to as tones, bins, etc. Each subcarrier may be modulated with data. Modulation symbols may be sent in the frequency domain with OFDM and in the time domain with SC-FDM. The spacing between adjacent subcarriers may be fixed, and the total number of subcarriers may be dependent on the system bandwidth. The system bandwidth may also be partitioned into subbands. For example, a subband may cover multiple resource blocks (RBs).

Example RF Transceiver

Figure 3:
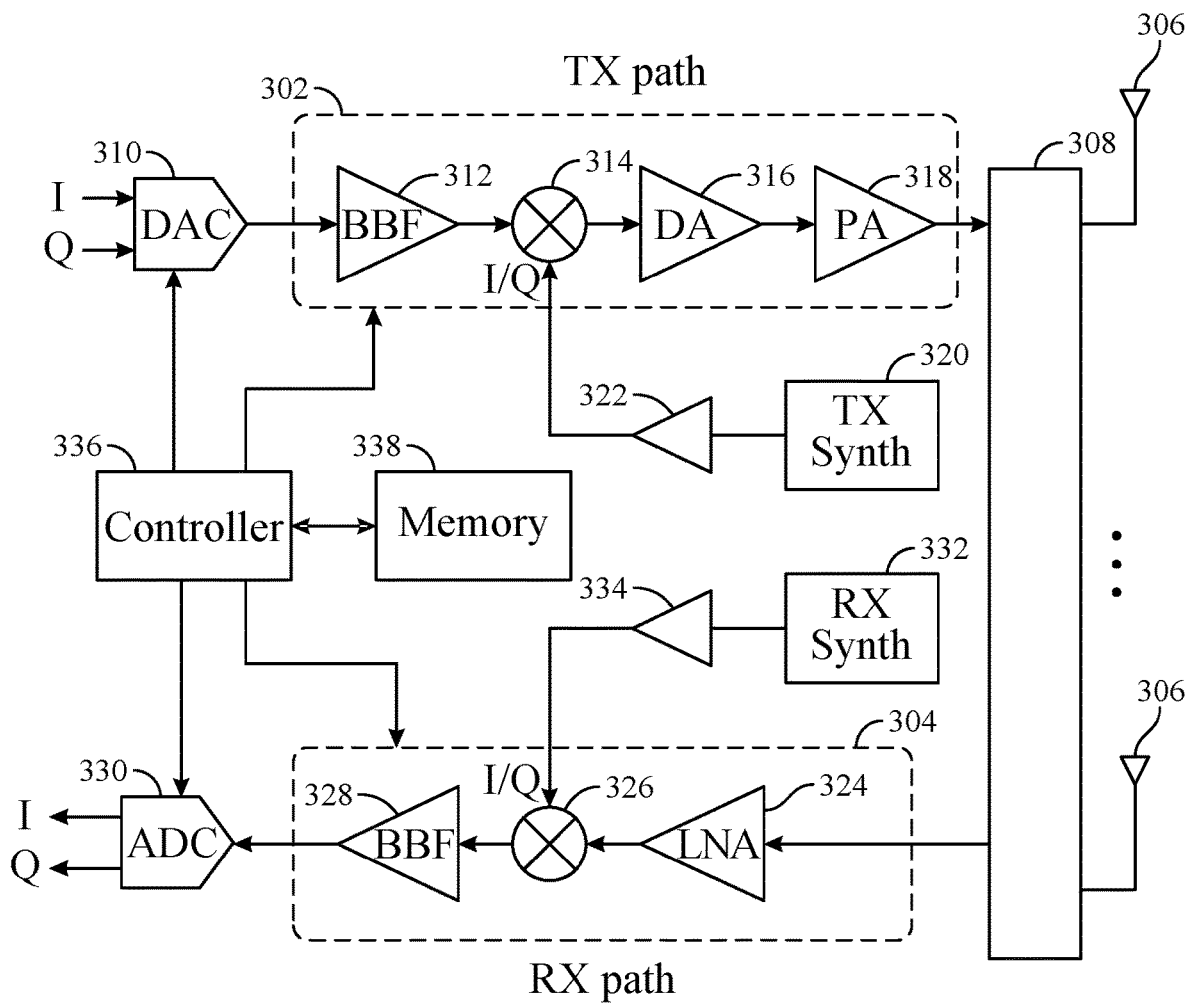
FIG. 3 is a block diagram of an example radio frequency (RF) transceiver, in which aspects of the present disclosure may be practiced.

FIG. 3 is a block diagram of an example radio frequency (RF) transceiver circuit 300, in accordance with certain aspects of the present disclosure. The RF transceiver circuit 300 includes at least one transmit (TX) path 302 (also known as a "transmit chain") for transmitting signals via one or more antennas 306 and at least one receive (RX) path 304 (also known as a "receive chain") for receiving signals via the antennas 306. When the TX path 302 and the RX path 304 share an antenna 306, the paths may be connected with the antenna via an interface 308, which may include any of various suitable RF devices, such as a switch, a duplexer, a diplexer, a multiplexer, and the like.

Receiving in-phase (I) and/or quadrature (Q) baseband analog signals from a digital-to-analog converter (DAC) 310, the TX path 302 may include a baseband filter (BBF) 312, a mixer 314, a driver amplifier (DA) 316, and a power amplifier (PA) 318. The BBF 312, the mixer 314, the DA 316, and the PA 318 may be included in a radio frequency integrated circuit (RFIC). For certain aspects, the PA 318 may be external to the RFIC.

The BBF 312 filters the baseband signals received from the DAC 310, and the mixer 314 mixes the filtered baseband signals with a transmit local oscillator (LO) signal to convert the baseband signal of interest to a different frequency (e.g., upconvert from baseband to a radio frequency). This frequency-conversion process produces the sum and difference frequencies between the LO frequency and the frequencies of the baseband signal of interest. The sum and difference frequencies are referred to as the "beat frequencies." The beat frequencies are typically in the RF range, such that the signals output by the mixer 314 are typically RF signals, which may be amplified by the DA 316 and/or by the PA 318 before transmission by the antenna(s) 306. While one mixer 314 is illustrated, several mixers may be used to upconvert the filtered baseband signals to one or more intermediate frequencies and to thereafter upconvert the intermediate frequency (IF) signals to a frequency for transmission.

The RX path 304 may include a low noise amplifier (LNA) 324, a mixer 326, and a baseband filter (BBF) 328. The LNA 324, the mixer 326, and the BBF 328 may be included in one or more RFICs, which may or may not be the same RFIC that includes the TX path components. RF signals received via the antenna(s) 306 may be amplified by the LNA 324, and the mixer 326 mixes the amplified RF signals with a receive local oscillator (LO) signal to convert the RF signal of interest to a different baseband frequency (e.g., downconvert). The baseband signals output by the mixer 326 may be filtered by the BBF 328 before being converted by an analog-to-digital converter (ADC) 330 to digital I and/or Q signals for digital signal processing.

Certain transceivers may employ frequency synthesizers with a variable-frequency oscillator (e.g., a VCO or a digitally controlled oscillator (DCO)) to generate a stable, tunable LO with a particular tuning range. Thus, the transmit LO may be produced by a TX frequency synthesizer 320, which may be buffered or amplified by amplifier 322 before being mixed with the baseband signals in the mixer 314. Similarly, the receive LO may be produced by an RX frequency synthesizer 332, which may be buffered or amplified by amplifier 334 before being mixed with the RF signals in the mixer 326. For certain aspects, a single frequency synthesizer may be used for both the TX path 302 and the RX path 304. In certain aspects, the TX frequency synthesizer 320 and/or RX frequency synthesizer 332 may include a frequency multiplier, such as a frequency doubler, that is driven by an oscillator (e.g., a VCO) in the frequency synthesizer. In some aspects, one or more frequency synthesizers of the transceiver circuit 300 may include a VCO implemented with cascode transistors, as described in more detail herein.

A controller 336 (e.g., controller/processor 280 in FIG. 2) may direct the operation of the RF transceiver circuit 300A, such as transmitting signals via the TX path 302 and/or receiving signals via the RX path 304. The controller 336 may be a processor, a digital signal processor (DSP), an application-specific integrated circuit (ASIC), a field-programmable gate array (FPGA) or other programmable logic device (PLD), discrete gate or transistor logic, discrete hardware components, or any combination thereof. A memory 338 (e.g., memory 282 in FIG. 2) may store data and/or program codes for operating the RF transceiver circuit 300. The controller 336 and/or the memory 338 may include control logic (e.g., complementary metal-oxide-semiconductor (CMOS) logic).

While FIGS. 1-3 provide wireless communications as an example application in which certain aspects of the present disclosure may be implemented to facilitate understanding, certain aspects described herein may be used for any of various other suitable systems.

Example Voltage-Controlled Oscillator (VCO)

An integral block of a radio is a frequency synthesizer (e.g., the synthesizer 320 or synthesizer 332 of FIG. 3). An output signal from a frequency synthesizer is used to generate a local oscillator (LO) signal to perform upconversion or downconversion based on the LO signal's frequency. The spectral purity of the frequency, measured in terms of phase noise, is important for the performance of a wireless device. The frequency synthesizer may include a voltage-controlled oscillator (VCO) for generating an oscillating signal, such as the LO signal.

Certain aspects of the present disclosure are directed towards a VCO. A VCO design entails many tradeoffs, including the sizing of the cross-coupled devices. Bigger size of the cross-coupled device may lead to a more robust startup gain, but may degrade the linearity of the transistors and/or lower the large signal quality factor (Q) of the loaded tank (the inductor (L)-capacitor (C) resonator) of the VCO. As the size of the cross-coupled transistors of the VCO increases to improve startup gain, the distortion of the VCO may increase. This all may result in poor phase noise performance of the VCO, impacting the performance of a radio's frequency synthesizer. In some cases, an increase in third-order distortion may result in the cross-coupled transistors being configured in a cut-off region during oscillation, degrading the phase noise performance of the VCO. Certain aspects of the present disclosure are directed towards a VCO architecture that provides a high startup gain and improves the large signal Q of the loaded tank (the LC resonant circuit) by suppressing the harmonics of the drain current, leading to improved phase noise performance.

Figure 4:
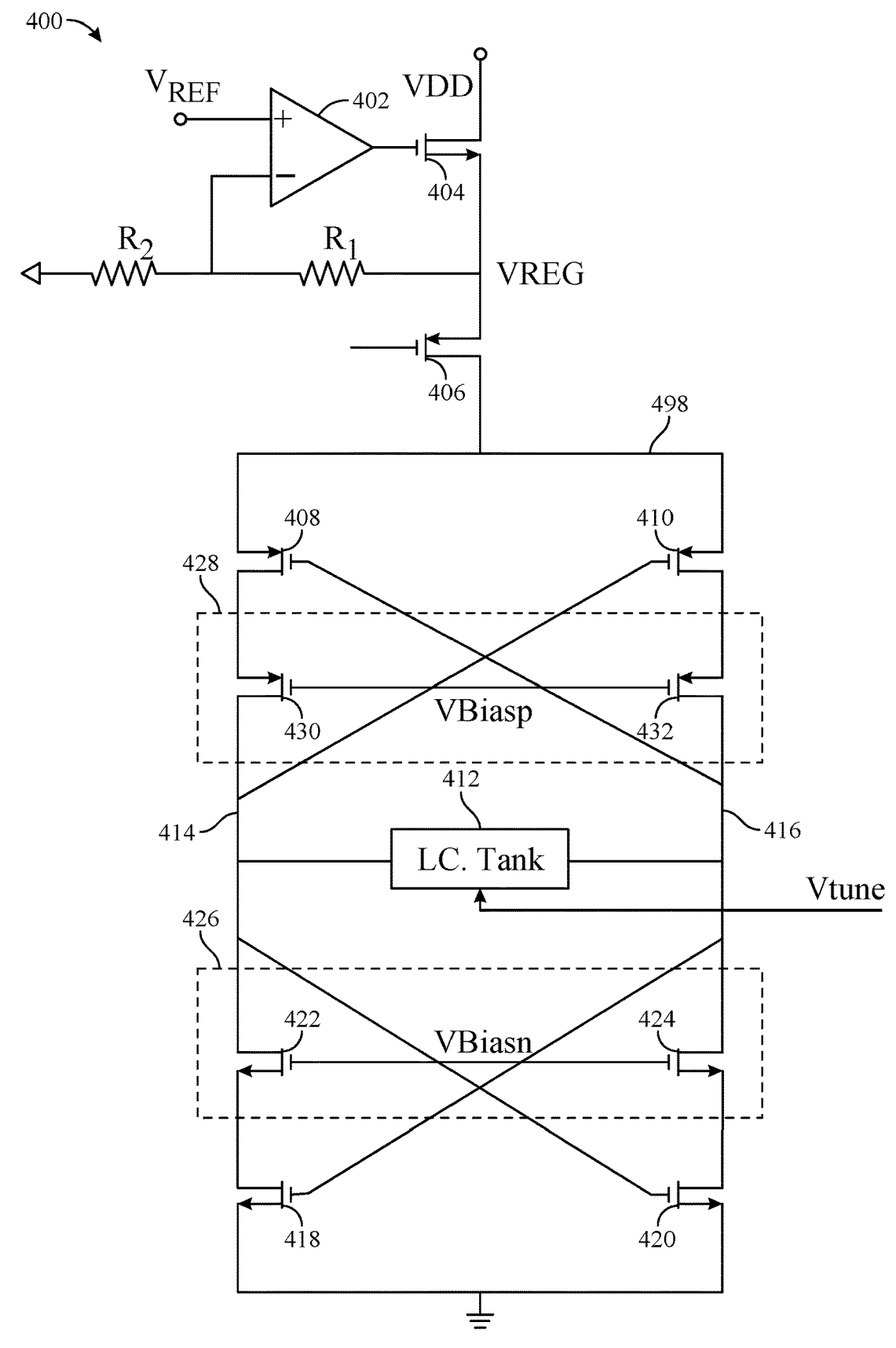
FIG. 4 illustrates an example voltage-controlled oscillator (VCO) implemented with cascode transistors, in accordance with certain aspects of the present disclosure.

FIG. 4 illustrates an example VCO 400 implemented with cascode transistors, in accordance with certain aspects of the present disclosure. The VCO 400 includes a low dropout regulator (LDO), which may be implemented by an amplifier 402 driving a transistor 404, a shown. The amplifier 402 has a positive terminal coupled to a reference voltage ($V_{REF}$) node and a negative terminal coupled to a node between resistive elements $R_1$ and $R_2$. The output of the amplifier 402 may be coupled to a gate of transistor 404. A drain of transistor 404 may be coupled to a voltage rail VDD. A source of transistor 404 may be coupled to a regulated voltage (VREG) node coupled to the resistive element $R_1$. VREG may be generated at the VREG node based on $V_{REF}$. In some aspects, a transistor 406 may be coupled between the VREG node and a common-mode voltage (Vcm) node 498 of the VCO 400. The gate of the transistor 406 may be biased using a bias voltage. As shown, a Vcm may be generated at the drain of the transistor 406 (e.g., at the Vcm node) for the VCO 400.

As shown, the VCO 400 may include cross-coupled p-type metal-oxide-semiconductor (PMOS) transistors 408, 410 (e.g., transconductance (gm) transistors). Sources of transistors 408, 410 are coupled to the Vcm node. A gate of transistor 408 may be coupled to an output node 416 of the VCO, and a gate of transistor 410 may be coupled to an output node 414, as shown. In some aspects, the VCO 400 may include a cascode transistor pair 428. For example, the VCO 400 may include a cascode transistor 430 having a source coupled to a drain of transistor 408 and a cascode transistor 432 having a source coupled to a drain of transistor 410. As shown, the cascode transistors 430, 432 may be PMOS transistors. A drain of transistor 430 may be coupled to the output node 414 of the VCO, and a drain of the transistor 432 may be coupled to an output node 416 of the VCO. A tank circuit 412 (e.g., LC tank circuit) may be coupled between the output nodes 414, 416. A tuning voltage (Vtune) may be provided to the tank circuit 412 to adjust the oscillating frequency of the VCO.

As shown, the VCO 400 also includes cross-coupled n-type metal-oxide-semiconductor (NMOS) transistors 418, 420 (e.g., transconductance (gm) transistors). Sources of transistors 418, 420 are coupled to a reference potential node (e.g., electric ground). As shown, the VCO 400 may include a cascode transistor pair 426 including cascode transistors 422, 424. For example, a source of transistor 422 may be coupled to a drain of transistor 418, and a source of transistor 424 may be coupled to a drain of transistor 420. A drain of transistor 422 may be coupled to the output node 414, and a drain of transistor 424 may be coupled to the output node 416. As shown, a gate of transistor 418 may be coupled to the output node 416, and a gate of transistor 420 may be coupled to the output node 414. Gates of the cascode transistors 422, 424 may be biased using an NMOS bias voltage (VBiasn), and gates of the cascode transistors 430, 432 may be biased using a PMOS bias voltage (VBiasp).

While the VCO 400 includes cascode transistor pairs 426, 428, the VCO 400 may be implemented with only cascode transistor pair 426 or cascode transistor pair 428. For instance, without the cascode transistor pair 428, the drains of transistors 408, 410 may be coupled to the output nodes 414, 416, respectively. Similarly, without the cascode transistor pair 426, the drains of transistors 418, 420 may be coupled to the output nodes 414, 416 and to the gates of transistors 420, 418, respectively.

With the cascode transistors, the non-linearity of the VCO may be reduced, and the fundamental tone of the VCO may be increased. Moreover, the Q of the VCO may be increased, and the phase noise performance of the VCO may be improved. In some aspects, the size of the cascode transistors may be set to reduce one or more harmonic currents of the VCO (e.g., second and third harmonics), improving the large signal quality factor and phase noise of the VCO. For example, the sizing of the cascode transistors may be selected based on an inverse relationship between the size of the cascode transistors and the cross-coupled transistors. The cascode transistors add a delay due to the resistance and capacitance of the cascode transistors where the size of the cascode transistors (e.g., and the cross-coupled transistors) may be selected in order to add a delay to cancel (or at least reduce) the phase shift from the excess gain of the first harmonic of drain current.

Figure 5:
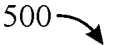
FIG. 5 illustrates a table providing example sizes of cascode transistors, in accordance with certain aspects of the present disclosure.
Figure 5:
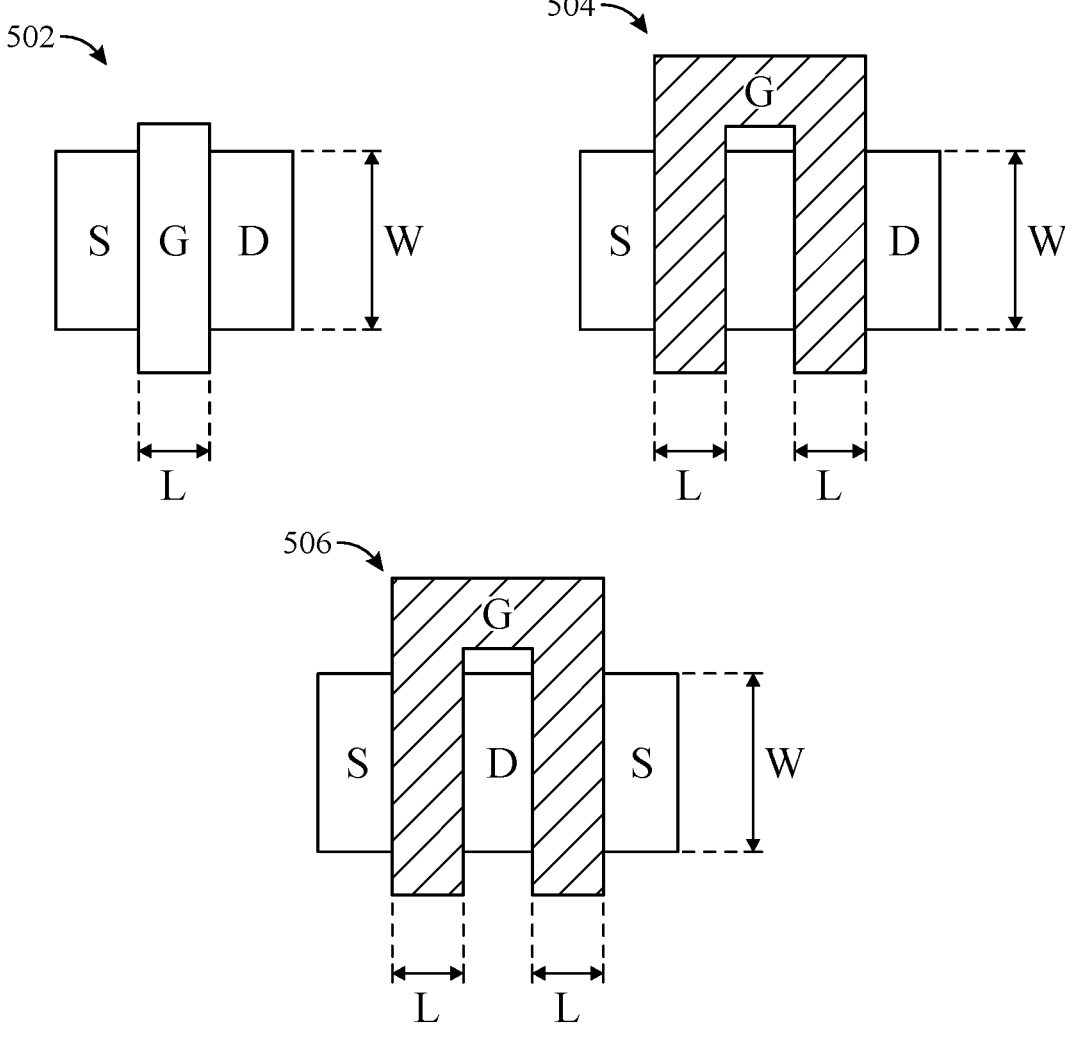

FIG. 5 illustrates a table 500 providing example sizes of cascode transistors selected based on the size of the cross-coupled transistors (e.g., gm transistors), in accordance with certain aspects of the present disclosure. As shown, when the cross-coupled transistor size (e.g., size of transistor 418 or 420) is 15 u/30n (e.g., has an effective length of 15 μm and an effective width of 30 nm), then the size of the corresponding cascode transistor (e.g., size of transistor 422 or 424) may range from 50 u/30n to 65 u/30n. When the cross-coupled transistor size is 20 u/30n, then the size of the cascode transistor may range from 32.5 u/30n to 45 u/30n. When the cross-coupled transistor size is 25 u/30n, then the size of the cascode transistors may range from 17.5 u/30n to 27.5 u/30n. When the cross-coupled transistor size is 30 u/30n, then the size of the cascode transistors may range from 7.5 u/30n to 15 u/30n.

As shown, for a single-finger transistor 502, the effective length (Leff) may be equal to the length (L) of the gate region as shown, and the effective width (Weff) may include the width (W) of the channel used to implement the source (S) and drain (D) for the transistor. For a two-finger transistor device 504 implemented as two series transistors, the effective width (Weff) may be twice (e.g., due to having two fingers) the width (W) of the channel (e.g., Weff=2×W), and the effective length (Leff) may be twice (e.g., due to having two fingers) the length (L) of the gate region (Leff=2×L). For a two-finger transistor device 506 implemented as two fingers in parallel, the effective width (Weff) may be twice (e.g., due to having two fingers) the width (W) of the channel (Weff=2×W), and the effective length (Leff) may be equal to the length (L) of the gate region (Leff=L).

Figure 6:
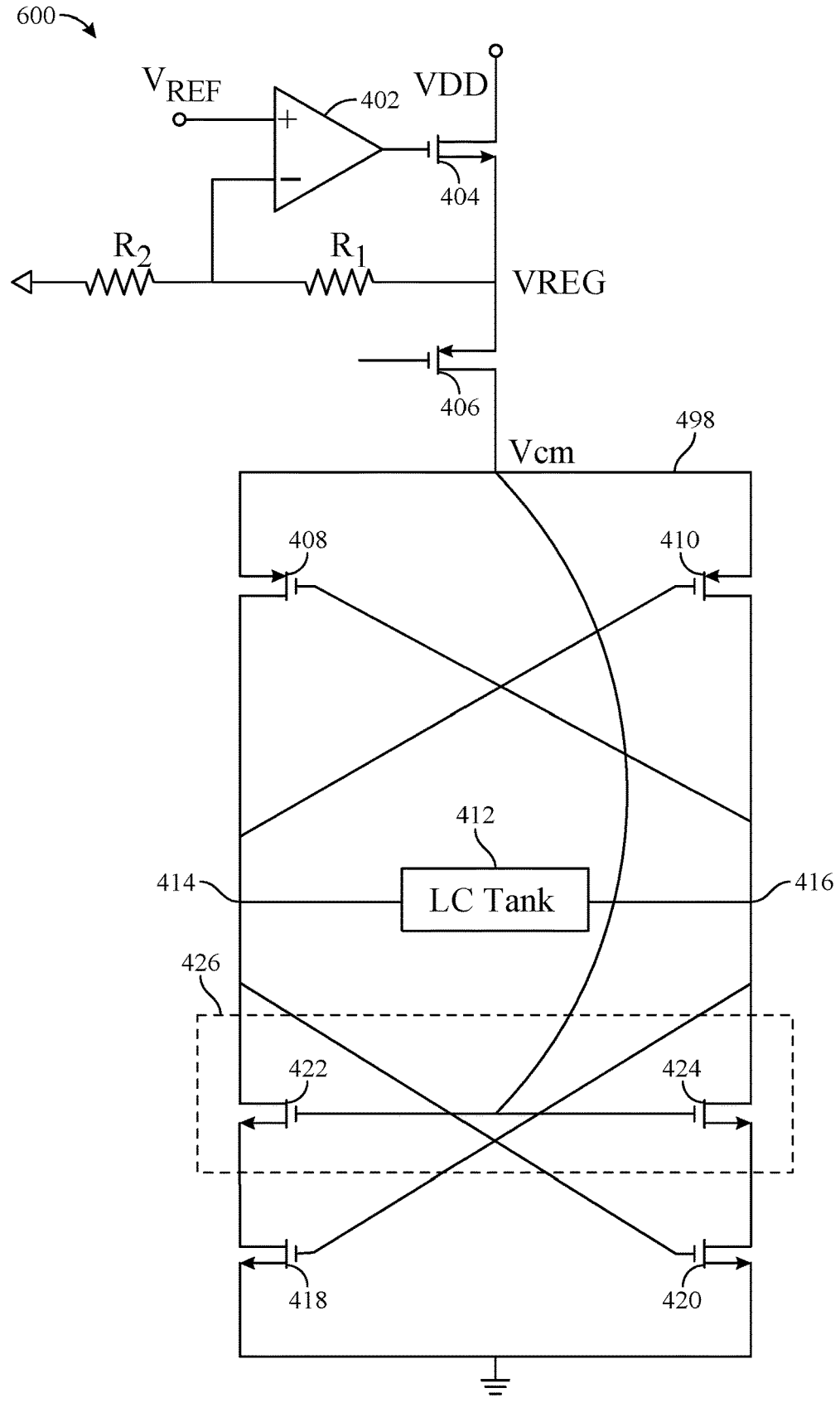
FIG. 6 illustrates a VCO having cascode transistors biased using a common-mode voltage (Vcm), in accordance with certain aspects of the present disclosure.

FIG. 6 illustrates a VCO 600 having NMOS cascode transistors biased using a common-mode voltage (Vcm), in accordance with certain aspects of the present disclosure. As described, a Vcm may be generated at the drain of the transistor 406 for the VCO. In some aspects, the Vcm may be provided to the gates of the cascode transistors 422, 424 to bias the cascode transistors. For example, the gates of cascode transistors 422, 424 may be coupled to the drain of transistor 406 (the Vcm node 498), as shown. By using the Vcm to bias the cascode transistors, an extra voltage source may not be used for the biasing, reducing the area consumption of the frequency synthesizer having the VCO 600.

Figure 7:
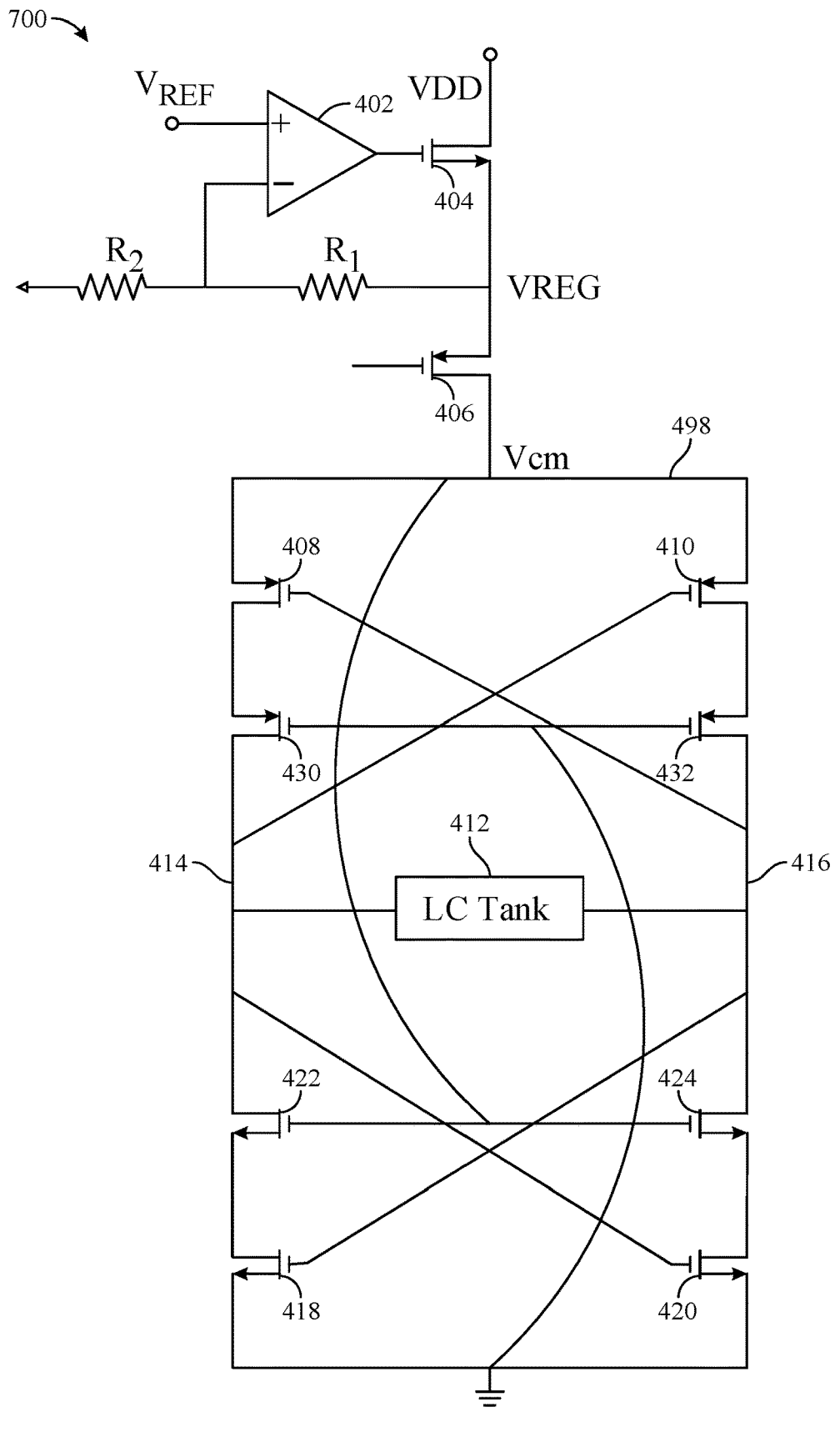
FIG. 7 illustrates a VCO having cascode transistors with gates coupled to a reference potential node and other cascode transistors with gates coupled to a Vcm node, in accordance with certain aspects of the present disclosure.

FIG. 7 illustrates a VCO 700 having PMOS cascode transistors with gates coupled to a reference potential node, in accordance with certain aspects of the present disclosure. For example, the gates of the cascode transistors 430, 432 may be coupled to the reference potential node (e.g., electric ground). In some cases, Vcm may be provided to the gates of the cascode transistors 422, 424, as described with respect to FIG. 6. In this manner, an extra voltage source for biasing the cascode transistors may not be used, reducing the area consumption of the synthesizer having the VCO 700.

Figure 8:
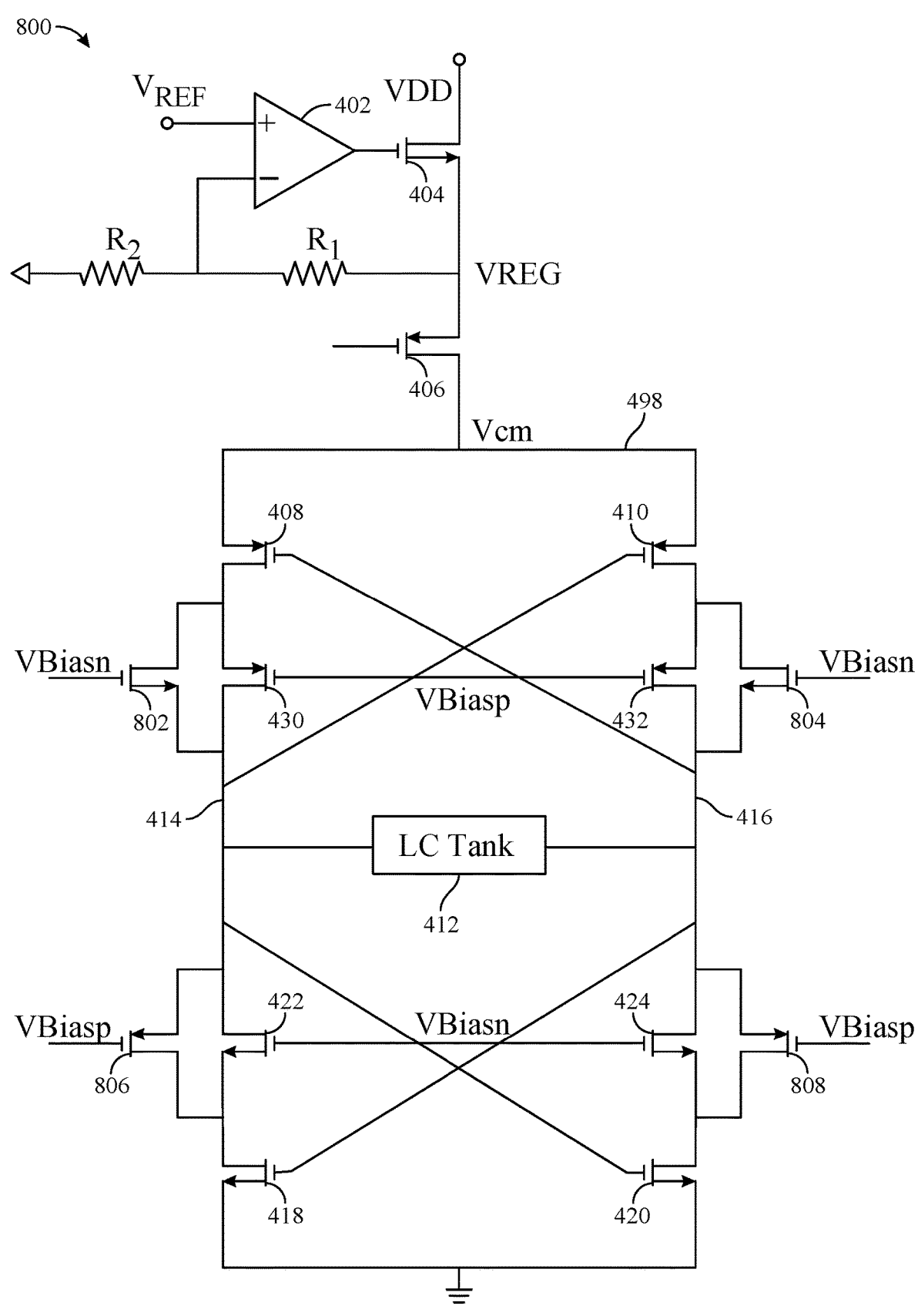
FIG. 8 illustrates a VCO implemented with transmission gates, in accordance with certain aspects of the present disclosure.

FIG. 8 illustrates a VCO 800 implemented with transmission gates (e.g., parallel transistors), in accordance with certain aspects of the present disclosure. Using transmission gates provides increased flexibility with respect to tuning transistors for improving the performance of the VCO. As shown, an NMOS transistor 802 may be coupled in parallel with PMOS cascode transistor 430. For example, a drain of transistor 802 may be coupled to the source of transistor 430, and a source of transistor 802 may be coupled to the drain of transistor 430, as shown. Similarly, an NMOS transistor 804 may be coupled in parallel with PMOS cascode transistor 432. Additionally or alternatively, PMOS transistors 806, 808 may be coupled in parallel with NMOS cascode transistors 422, 424, respectively. For example, sources of PMOS transistors 806, 808 may be coupled to the drains of transistors 422, 424, respectively, and drains of transistors 806, 808 may be coupled to the sources of transistors 422, 424, respectively.

As shown, the transistors 422, 424, 802, 804 may be biased using VBiasn, and the transistors 430, 432, 806, 808 may be biased using VBiasp. In other aspects, the gates of transistors 422, 424, 802, 804 may be coupled to the Vcm node, and/or the gates of the transistors 430, 432, 806, 808 may be coupled to the reference potential node, in a similar manner as described with respect to FIG. 7.

Figure 9:
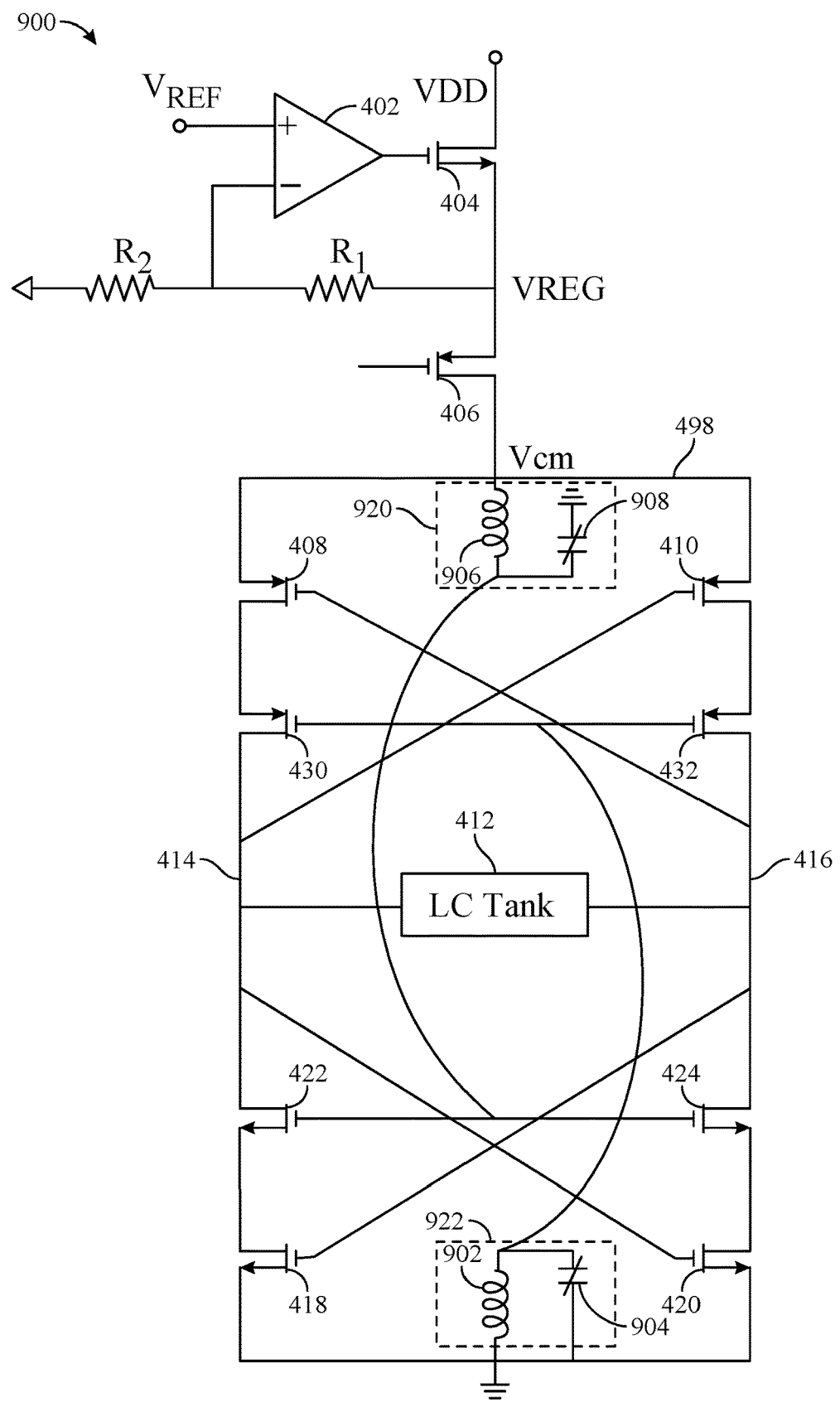
FIGS. 9, 10, and 11 illustrate a VCO implemented with filters, in accordance with certain aspects of the present disclosure.
Figure 10:
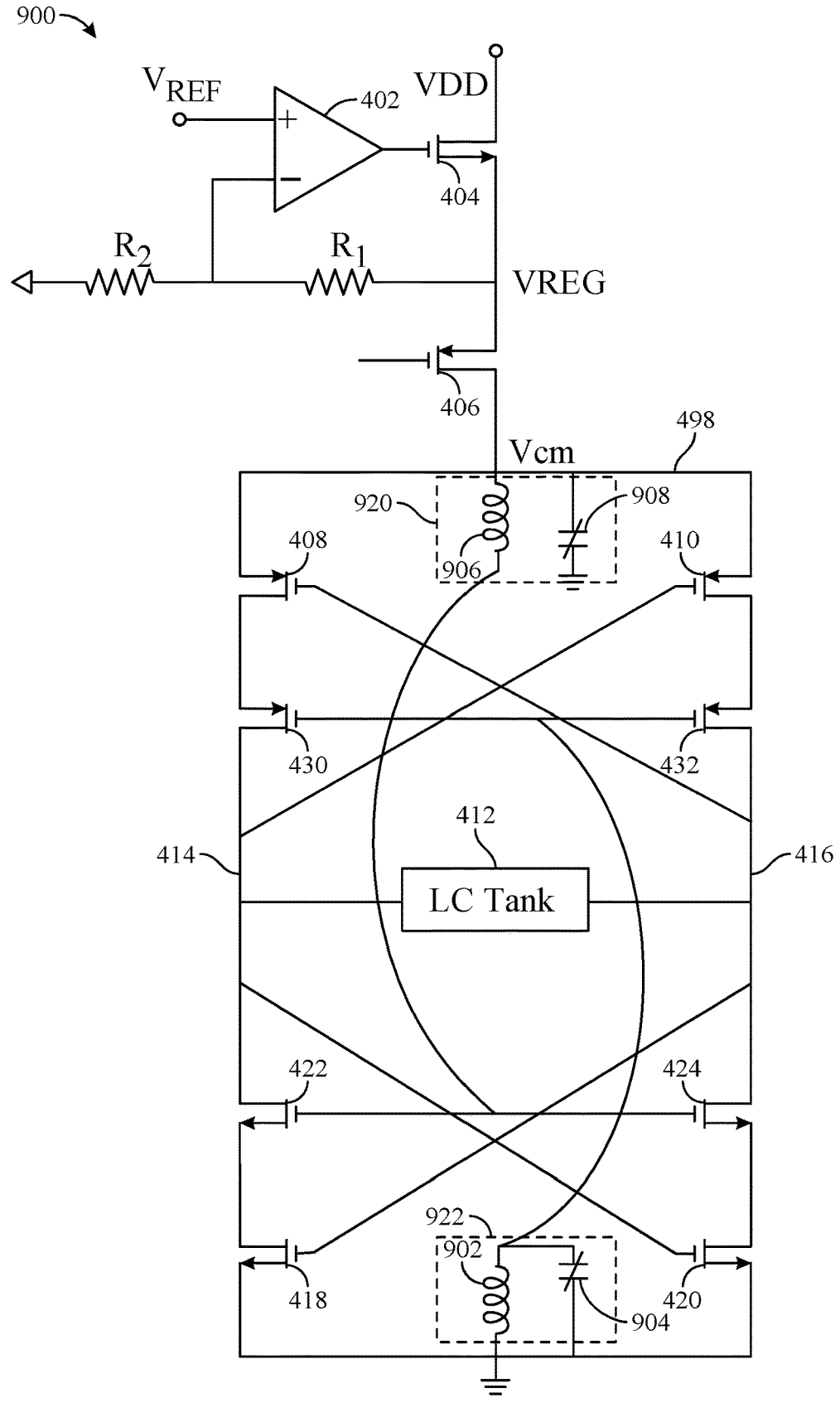
Figure 11:
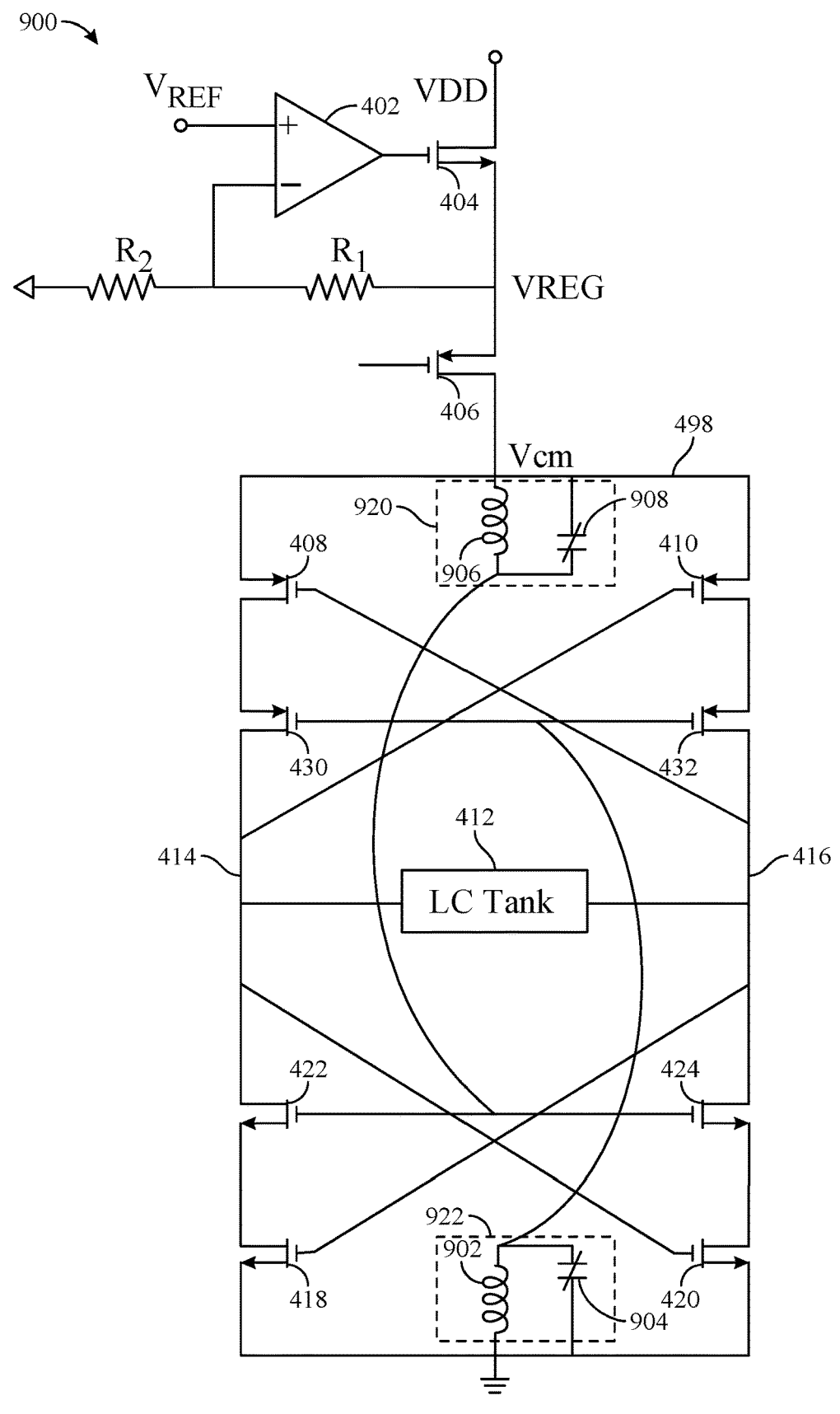

FIGS. 9, 10, and 11 illustrate a VCO 900 implemented with filters, in accordance with certain aspects of the present disclosure. As shown in FIG. 9, the VCO 900 may include an inductive element 906 coupled between the Vcm node and the gates of cascode transistors 422, 424. The inductive element 906 may be used to implement a filter 920 for the VCO. In some aspects, the filter 920 may be implemented with (i) the inductive element 906 and (ii) a capacitive element 908 coupled between the reference potential node and the gates of transistors 422, 424. Similarly, an inductive element 902 may be coupled between the reference potential node and the gates of cascode transistors 430, 432. The inductive element 902 may be used to implement a filter 922 for the VCO. In some aspects, the filter 922 may be implemented with (i) the inductive element 902 and (ii) a capacitive element 904 coupled between the reference potential node and the gates of transistors 430, 432. In some aspects, one or more of the capacitive elements 904, 908 may be variable capacitive elements, as shown. As shown in FIG. 10, the capacitive element 908 may be coupled between the Vcm node and the reference potential node (e.g., electric ground). In some aspects, as shown in FIG. 11, the capacitive element 908 may be coupled in parallel with the inductive element 906, implementing a notch filter. The filters 920, 922 (e.g., notch filters) may be tuned to filter out noise at one or more frequencies (e.g., harmonic frequencies), such as twice the oscillating frequency of the VCO, further improving phase noise and VCO performance.

Example Techniques for Generating an Oscillating Signal

FIG. 12 is a flow diagram illustrating example operations 1200 for generating an oscillating signal, in accordance with certain aspects of the present disclosure. The operations 1200 may be performed, for example, by a VCO such as the VCO 400, 600, 700, 800, 900 or by a frequency synthesizer, such as the synthesizer 320 or synthesizer 332, which may include such a VCO.

At block 1202, the synthesizer may generate a tuning voltage for the VCO, or the VCO may receive a tuning voltage (e.g., from another portion of the frequency synthesizer). At block 1204, the VCO generates an oscillating signal (having a frequency based on the tuning voltage). The VCO may include a first NMOS transistor (e.g., transistor 418 of FIG. 4) having a gate coupled to a first output (e.g., output node 416) of the VCO. The VCO may also include a second NMOS transistor (e.g., transistor 420) having a gate coupled to a second output (e.g., output node 414) of the VCO. In some aspects, the VCO may include a first NMOS cascode transistor (e.g., transistor 422) coupled in cascode between the first NMOS transistor and the negative output and a second NMOS cascode transistor (e.g., transistor 424) coupled in cascode between the second NMOS transistor and the positive output. At block 1206, the synthesizer provides a Vcm at a Vcm node (e.g., Vcm node 498) of the VCO to gates of the first NMOS cascode transistor and the second NMOS cascode transistor.

In some aspects, generating the oscillating signal may include filtering a Vcm signal at the Vcm node using a filter (e.g., filter 920). At least a portion of the filter may be coupled between the Vcm node and the gates of the first NMOS cascode transistor and the second NMOS cascode transistor. The filter may include an inductive element (e.g., inductive element 906). The filter may also include a capacitive element (e.g., capacitive element 908) coupled to the inductive element.

In some aspects, the VCO may include a first PMOS transistor (e.g., PMOS transistor 408) having a gate coupled to the positive output of the VCO and a second PMOS (e.g., PMOS transistor 410) transistor having a gate coupled to the negative output of the VCO. The VCO may also include a first PMOS cascode transistor (e.g., transistor 430) coupled in cascode between the first PMOS transistor and the negative output and a second PMOS cascode transistor (e.g., transistor 432) coupled in cascode between the second PMOS transistor and the positive output. Gates of the first PMOS cascode transistor and the second PMOS cascode transistor may be coupled to a reference potential node. In some aspects, the VCO also includes a third NMOS transistor (e.g., transistor 802) having a drain coupled to a source of the first PMOS cascode transistor and having a source coupled to a drain of the first PMOS cascode transistor and a fourth NMOS transistor (e.g., transistor 804) having a drain coupled to a source of the second cascode PMOS transistor and having a source coupled to a drain of the second PMOS cascode transistor. In some aspects, the generating the oscillating signal includes filtering a reference potential voltage at a reference potential node using a filter (e.g., filter 922). At least a portion of the filter may be coupled between the reference potential node and the gates of the first PMOS cascode transistor and the second PMOS cascode transistor. The filter may include an inductive element, and in some aspects, a capacitive element coupled to the inductive element.

In some aspects, the VCO may include a first PMOS transistor (e.g., PMOS transistor 806) having a drain coupled to a source of the first NMOS cascode transistor and having a source coupled to a drain of the first NMOS cascode transistor and a second PMOS transistor (e.g., PMOS transistor 808) having a drain coupled to a source of the second NMOS cascode transistor and having a source coupled to a source of the second NMOS cascode transistor. In some aspects, each of the first NMOS cascode transistor and second NMOS cascode transistor may have a width between 15 microns and 50 microns, and each of the first NMOS transistor and the second NMOS transistor may have a width between 15 microns and 30 microns. In some aspects, the VCO may include a tank circuit (e.g., tank circuit 412) coupled between the positive output and the negative output.

EXAMPLE ASPECTS

In addition to the various aspects described above, specific combinations of aspects are within the scope of the present disclosure, some of which are detailed below:

Aspect 1: A voltage-controlled oscillator (VCO), comprising: a first n-type metal-oxide-semiconductor (NMOS) transistor having a gate coupled to a first output of the VCO; a second NMOS transistor having a gate coupled to a second output of the VCO; a first NMOS cascode transistor coupled in cascode between the first NMOS transistor and the second output; and a second NMOS cascode transistor coupled in cascode between the second NMOS transistor and the first output, wherein gates of the first NMOS cascode transistor and the second NMOS cascode transistor are coupled to a common-mode voltage (Vcm) node of the VCO.

Aspect 2: The VCO of Aspect 1, further comprising a filter coupled between the Vcm node and the gates of the first NMOS cascode transistor and the second NMOS cascode transistor.

Aspect 3: The VCO of Aspect 2, wherein the filter comprises: an inductive element; and a capacitive element coupled to the inductive element.

Aspect 4: The VCO according to any of Aspects 1-3, further comprising: a first p-type metal-oxide-semiconductor (PMOS) transistor having a gate coupled to the first output of the VCO; a second PMOS transistor having a gate coupled to the second output of the VCO; a first PMOS cascode transistor coupled in cascode between the first PMOS transistor and the second output; and a second PMOS cascode transistor coupled in cascode between the second PMOS transistor and the first output.

Aspect 5: The VCO of Aspect 4, wherein gates of the first PMOS cascode transistor and the second PMOS cascode transistor are coupled to a reference potential node.

Aspect 6: The VCO of Aspect 4 or 5, further comprising: a third NMOS transistor having a drain coupled to a source of the first PMOS cascode transistor and having a source coupled to a drain of the first PMOS cascode transistor; and a fourth NMOS transistor having a drain coupled to a source of the second PMOS cascode transistor and having a source coupled to a drain of the second PMOS cascode transistor.

Aspect 7: The VCO according to any of Aspects 4-6, further comprising a filter coupled between a reference potential node and the gates of the first PMOS cascode transistor and the second PMOS cascode transistor.

Aspect 8: The VCO of Aspect 7, wherein the filter comprises an inductive element.

Aspect 9: The VCO of Aspect 8, wherein the filter comprises a capacitive element coupled to the inductive element.

Aspect 10: The VCO according to any of Aspects 1-9, further comprising: a first p-type metal-oxide-semiconductor (PMOS) transistor having a drain coupled to a source of the first NMOS cascode transistor and having a source coupled to a drain of the first NMOS cascode transistor; and a second PMOS transistor having a drain coupled to a source of the second NMOS cascode transistor and having a source coupled to a drain of the second NMOS cascode transistor.

Aspect 11: The VCO according to any of Aspects 1-10, further comprising a tank circuit coupled between the second output and the first output.

Aspect 12: The VCO according to any of Aspects 1-11, wherein: each of the first NMOS cascode transistor and the second NMOS cascode transistor has a width between 15 microns and 50 microns; and each of the first NMOS transistor and the second NMOS transistor has a width between 15 microns and 30 microns.

Aspect 13: A method for oscillating signal generation, the method comprising: generating, via a voltage-controlled oscillator (VCO), an oscillating signal, wherein the VCO comprises: a first n-type metal-oxide-semiconductor (NMOS) transistor having a gate coupled to a first output of the VCO; a second NMOS transistor having a gate coupled to a second output of the VCO; a first NMOS cascode transistor coupled in cascode between the first NMOS transistor and the second output; and a second NMOS cascode transistor coupled in cascode between the second NMOS transistor and the first output; and providing a common-mode voltage (Vcm) at a Vcm node of the VCO to gates of the first NMOS cascode transistor and the second NMOS cascode transistor.

Aspect 14: The method of Aspect 13, wherein generating the oscillating signal comprises filtering a Vcm signal at the Vcm node using a filter, at least a portion of the filter being coupled between the Vcm node and the gates of the first NMOS cascode transistor and the second NMOS cascode transistor.

Aspect 15: The method of Aspect 14, wherein the filter comprises an inductive element.

Aspect 16: The method according to any of Aspects 13-15, wherein the VCO further includes: a first PMOS transistor having a gate coupled to the first output of the VCO; a second PMOS transistor having a gate coupled to the second output of the VCO; a first PMOS cascode transistor coupled in cascode between the first PMOS transistor and the second output; and a second PMOS cascode transistor coupled in cascode between the second PMOS transistor and the first output.

Aspect 17: The method of Aspect 16, wherein gates of the first PMOS cascode transistor and the second PMOS cascode transistor are coupled to a reference potential node.

Aspect 18: The method of Aspect 16 or 17, wherein the VCO further includes: a third NMOS transistor having a drain coupled to a source of the first PMOS cascode transistor and having a source coupled to a drain of the first PMOS cascode transistor; and a fourth NMOS transistor having a drain coupled to a source of the second PMOS cascode transistor and having a source coupled to a drain of the second PMOS cascode transistor.

Aspect 19: The method according to any of Aspects 16-18, wherein generating the oscillating signal comprises filtering a reference potential voltage at a reference potential node using a filter, at least a portion of the filter being coupled between the reference potential node and the gates of the first PMOS cascode transistor and the second PMOS cascode transistor.

Aspect 20: The method of Aspect 19, wherein the filter comprises an inductive element.

Aspect 21: The method of Aspect 20, wherein the filter further comprises a capacitive element coupled to the inductive element.

Aspect 22: The method according to any of Aspects 13-21, wherein the VCO further includes: a first PMOS transistor having a drain coupled to a source of the first NMOS cascode transistor and having a source coupled to a drain of the first NMOS cascode transistor; and a second PMOS transistor having a drain coupled to a source of the second NMOS cascode transistor and having a source coupled to a source of the second NMOS cascode transistor.

Aspect 23: A voltage-controlled oscillator (VCO), comprising: a first p-type metal-oxide-semiconductor (PMOS) transistor having a gate coupled to a first output of the VCO; a second PMOS transistor having a gate coupled to a second output of the VCO; a first PMOS cascode transistor coupled in cascode between the first PMOS transistor and the second output; and a second PMOS cascode transistor coupled in cascode between the second PMOS transistor and the first output, wherein gates of the first PMOS cascode transistor and the second PMOS cascode transistor are coupled to a reference potential node of the VCO.

Aspect 24: The VCO of Aspect 23, further comprising: a first n-type metal-oxide-semiconductor (NMOS) transistor having a drain coupled to a source of the first PMOS cascode transistor and having a source coupled to a drain of the first PMOS cascode transistor; and a second NMOS transistor having a drain coupled to a source of the second PMOS cascode transistor and having a source coupled to a drain of the second PMOS cascode transistor.

Aspect 25: The VCO of Aspect 23 or 24, further comprising a filter coupled between the reference potential node and the gates of the first PMOS cascode transistor and the second PMOS cascode transistor.

Aspect 26: The VCO of Aspect 25, wherein the filter comprises an inductive element.

Aspect 27: The VCO of Aspect 26, wherein the filter comprises a capacitive element coupled to the inductive element.

Aspect 28: An apparatus for wireless communications, comprising: a mixer; and a synthesizer having an output coupled to an input of the mixer, wherein the synthesizer comprises a voltage-controlled oscillator (VCO) including: a first n-type metal-oxide-semiconductor (NMOS) transistor having a gate coupled to a first output of the VCO; a second NMOS transistor having a gate coupled to a second output of the VCO; a first NMOS cascode transistor coupled in cascode between the first NMOS transistor and the second output; and a second NMOS cascode transistor coupled in cascode between the second NMOS transistor and the first output, wherein gates of the first NMOS cascode transistor and the second NMOS cascode transistor are coupled to a common-mode voltage (Vcm) node of the VCO.

The above description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim.

The various operations of methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. A voltage-controlled oscillator (VCO), comprising:
a first n-type metal-oxide-semiconductor (NMOS) transistor having a gate coupled to a first output of the VCO;
a second NMOS transistor having a gate coupled to a second output of the VCO;
a first NMOS cascode transistor coupled in cascode between the first NMOS transistor and the second output; and
a second NMOS cascode transistor coupled in cascode between the second NMOS transistor and the first output, wherein gates of the first NMOS cascode transistor and the second NMOS cascode transistor are coupled to a common-mode voltage (Vcm) node of the VCO.

2. The VCO of claim 1, further comprising a filter coupled between the Vcm node and the gates of the first NMOS cascode transistor and the second NMOS cascode transistor.

3. The VCO of claim 2, wherein the filter comprises:
an inductive element; and
a capacitive element coupled to the inductive element.

4. The VCO of claim 1, further comprising:
a first p-type metal-oxide-semiconductor (PMOS) transistor having a gate coupled to the first output of the VCO;
a second PMOS transistor having a gate coupled to the second output of the VCO;
a first PMOS cascode transistor coupled in cascode between the first PMOS transistor and the second output; and
a second PMOS cascode transistor coupled in cascode between the second PMOS transistor and the first output.

5. The VCO of claim 4, wherein gates of the first PMOS cascode transistor and the second PMOS cascode transistor are coupled to a reference potential node.

6. The VCO of claim 4, further comprising:
a third NMOS transistor having a drain coupled to a source of the first PMOS cascode transistor and having a source coupled to a drain of the first PMOS cascode transistor; and
a fourth NMOS transistor having a drain coupled to a source of the second PMOS cascode transistor and having a source coupled to a drain of the second PMOS cascode transistor.

7. The VCO of claim 4, further comprising a filter coupled between a reference potential node and the gates of the first PMOS cascode transistor and the second PMOS cascode transistor.

8. The VCO of claim 7, wherein the filter comprises an inductive element.

9. The VCO of claim 8, wherein the filter comprises a capacitive element coupled to the inductive element.

10. The VCO of claim 1, further comprising:
a first p-type metal-oxide-semiconductor (PMOS) transistor having a drain coupled to a source of the first NMOS cascode transistor and having a source coupled to a drain of the first NMOS cascode transistor; and
a second PMOS transistor having a drain coupled to a source of the second NMOS cascode transistor and having a source coupled to a drain of the second NMOS cascode transistor.

11. The VCO of claim 1, further comprising a tank circuit coupled between the second output and the first output.

12. The VCO of claim 1, wherein:
each of the first NMOS cascode transistor and the second NMOS cascode transistor has a width between 15 microns and 50 microns; and
each of the first NMOS transistor and the second NMOS transistor has a width between 15 microns and 30 microns.

13. A method for oscillating signal generation, the method comprising:
generating, via a voltage-controlled oscillator (VCO), an oscillating signal, wherein the VCO comprises:
a first n-type metal-oxide-semiconductor (NMOS) transistor having a gate coupled to a first output of the VCO;
a second NMOS transistor having a gate coupled to a second output of the VCO;
a first NMOS cascode transistor coupled in cascode between the first NMOS transistor and the second output; and
a second NMOS cascode transistor coupled in cascode between the second NMOS transistor and the first output; and
providing a common-mode voltage (Vcm) at a Vcm node of the VCO to gates of the first NMOS cascode transistor and the second NMOS cascode transistor.

14. The method of claim 13, wherein generating the oscillating signal comprises filtering a Vcm signal at the Vcm node using a filter, at least a portion of the filter being coupled between the Vcm node and the gates of the first NMOS cascode transistor and the second NMOS cascode transistor.

15. The method of claim 14, wherein the filter comprises an inductive element.

16. A voltage-controlled oscillator (VCO), comprising:
a first p-type metal-oxide-semiconductor (PMOS) transistor having a gate coupled to a first output of the VCO;
a second PMOS transistor having a gate coupled to a second output of the VCO;
a first PMOS cascode transistor coupled in cascode between the first PMOS transistor and the second output;
a second PMOS cascode transistor coupled in cascode between the second PMOS transistor and the first output, wherein gates of the first PMOS cascode transistor and the second PMOS cascode transistor are coupled to a reference potential node of the VCO;
a first n-type metal-oxide-semiconductor (NMOS) transistor having a drain coupled to a source of the first PMOS cascode transistor and having a source coupled to a drain of the first PMOS cascode transistor; and
a second NMOS transistor having a drain coupled to a source of the second PMOS cascode transistor and having a source coupled to a drain of the second PMOS cascode transistor.

17. The VCO of claim 16, further comprising a filter coupled between the reference potential node and the gates of the first PMOS cascode transistor and the second PMOS cascode transistor.

18. The VCO of claim 17, wherein the filter comprises an inductive element.

19. The VCO of claim 18, wherein the filter comprises a capacitive element coupled to the inductive element.

20. The VCO of claim 16, further comprising:

a third NMOS transistor having a gate coupled to the first output of the VCO;

a fourth NMOS transistor having a gate coupled to the second output of the VCO;

a first NMOS cascode transistor coupled in cascode between the third NMOS transistor and the second output; and a second NMOS cascode transistor coupled in cascode between the fourth NMOS transistor and the first output, wherein gates of the first NMOS cascode transistor and the second NMOS cascode transistor are coupled to a common-mode voltage (Vcm) node of the VCO.

21. A voltage-controlled oscillator (VCO), comprising:

a first p-type metal-oxide-semiconductor (PMOS) transistor having a gate coupled to a first output of the VCO;

a second PMOS transistor having a gate coupled to a second output of the VCO;

a first PMOS cascode transistor coupled in cascode between the first PMOS transistor and the second output;

a second PMOS cascode transistor coupled in cascode between the second PMOS transistor and the first output, wherein gates of the first PMOS cascode transistor and the second PMOS cascode transistor are coupled to a reference potential node of the VCO; and a filter coupled between the reference potential node and the gates of the first PMOS cascode transistor and the second PMOS cascode transistor.

22. The VCO of claim 21, further comprising:

a first n-type metal-oxide-semiconductor (NMOS) transistor having a gate coupled to the first output of the VCO;

a second NMOS transistor having a gate coupled to the second output of the VCO;

a first NMOS cascode transistor coupled in cascode between the first NMOS transistor and the second output; and a second NMOS cascode transistor coupled in cascode between the second NMOS transistor and the first output, wherein gates of the first NMOS cascode transistor and the second NMOS cascode transistor are coupled to a common-mode voltage (Vcm) node of the VCO.

23. The VCO of claim 1, further comprising:

a first p-type metal-oxide-semiconductor (PMOS) transistor having a gate coupled to the first output of the VCO and a source coupled to the Vcm node; and a second PMOS transistor having a gate coupled to the second output of the VCO and a source coupled to the Vcm node.

* * * * *